(12) United States Patent
Iba (10) Patent No.: US 8,421,138 B2
(45) Date of Patent: Apr. 16, 2013

(54) MAGNETIC TUNNELING JUNCTION DEVICE WITH RECESSED MAGNETIC FREE LAYER

(75) Inventor: Yoshihisa Iba, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 107 days.

(21) Appl. No.: 13/089,534

(22) Filed: Apr. 19, 2011

(65) Prior Publication Data
US 2012/0038011 A1 Feb. 16, 2012

(30) Foreign Application Priority Data
Aug. 16, 2010 (JP) .................... 2010-181586

(51) Int. Cl.
*H01L 21/02* (2006.01)
(52) U.S. Cl.
USPC .......... 257/295; 257/288; 257/296; 257/421; 257/424; 257/E29.323; 257/E21.665
(58) Field of Classification Search .............. 257/295, 257/288, 296, 421, 424, 427, E29.323, E21.665
See application file for complete search history.

(56) References Cited

U.S. PATENT DOCUMENTS
6,806,527 B2 * 10/2004 Tuttle ........................... 257/296
2011/0101431 A1 * 5/2011 Takeuchi et al. ............... 257/295

FOREIGN PATENT DOCUMENTS
JP 2001-168418 A 6/2001
JP 2001-284679 A 10/2001
JP 2002-299724 A 10/2002

* cited by examiner

*Primary Examiner* — Eva Yan Montalvo
(74) *Attorney, Agent, or Firm* — Westerman, Hattori, Daniels & Adrian, LLP

(57) ABSTRACT

A magnetic pinned layer is formed over a substrate. An insulating film is formed over the magnetic pinned layer. A recess is formed in and through the insulating film. A tunneling insulating film is formed over a bottom of the recess. A first magnetic free layer is formed over the bottom of the recess via the tunneling insulating film. A second magnetic free layer is formed over the insulating film and made of a same material as the first magnetic free layer. A non-magnetic film is formed on sidewalls of the recess, extending from the first magnetic free layer to the second magnetic free layer and made of oxide of the material of the first magnetic free layer. An upper electrode is disposed over the first magnetic free layer, non-magnetic film and second magnetic free layer, and electrically connected to the first magnetic free layer and second magnetic free layer.

4 Claims, 11 Drawing Sheets

MAGNETIC TUNNELING JUNCTION DEVICE WITH RECESSED MAGNETIC FREE LAYER

CROSS-REFERENCE TO RELATED APPLICATION

This application is based upon and claims the benefit of priority of the prior Japanese Patent Application No. JP 2010-181586, filed on Aug. 16, 2010, the entire contents of which are incorporated herein by reference.

FIELD

The embodiments discussed herein are related to a magnetic tunneling junction device having a tunneling insulating film sandwiched between a magnetic pinned layer and a magnetic free layer and its manufacturing method.

BACKGROUND

A magnetic tunneling junction (MTJ) is used in a nonvolatile magnetic memory. Since a lamination film (hereinafter called an MTJ lamination film) constituting MTJ contains transition metal, it is difficult to chemically dry etch this MTJ lamination film. Ion milling is therefore used to pattern the MTJ lamination film. As ion milling is used, a side wall of a patterned MTJ lamination film is inclined so that size control at high precision is difficult. Re-sputtered metal atoms may attach the side wall of the patterned MTJ lamination film, and a short circuit fault between upper and lower electrodes is likely to occur. Technology of pattering an MTJ lamination film without using ion milling has been proposed.

PATENT DOCUMENT

[Patent Document 1] Japanese Laid-open Patent Publication No. 2002-299724
[Patent Document 2] Japanese Laid-open Patent Publication No. 2001-284679
[Patent Document 3] Japanese Laid-open Patent Publication No. 2001-168418

SUMMARY

A patterned MTJ lamination film can be formed without using ion milling by depositing the MTJ lamination film in a recess formed through an insulating film. In this method, a magnetic free layer is deposited on a side wall of the recess. In the result, a volume of the magnetic free layer becomes large. Consequently, it is difficult to reduce a current for writing. The magnetic free layer can be prevented from being deposited on the side walls by forming eaves at an opening of the recess. However, in this method, end faces of the magnetic free layer and a tunneling insulating film are exposed to an atmosphere during film formation and an air. Therefore, it is concerned that leakage current increases caused by foreign matters adhered onto the end faces.

It is desired that increases of current for writing and leakage current can be suppressed without using ion milling.

According to an aspect of the invention, a magnetic tunneling junction device includes:
a magnetic pinned layer formed over a substrate;
an insulating film formed over the magnetic pinned layer;
a recess formed in and through the insulating film;
a tunneling insulating film formed on a bottom of the recess;
a first magnetic free layer formed over the tunneling insulating film;
a second magnetic free layer formed over the insulating film and made of a same magnetic material as the first magnetic free layer;
a non-magnetic film formed on side walls of the recess, extending from the first magnetic free layer to the second magnetic free layer and made of oxide of the magnetic material of the first magnetic free layer; and
an upper electrode disposed over the first magnetic free layer, the non-magnetic film and the second magnetic free layer, and electrically connected to the first magnetic free layer and the second magnetic free layer.

According to another aspect of the invention, a method of manufacturing a magnetic tunneling junction device, includes:
forming a magnetic pinned layer over a substrate;
forming an insulating film over the magnetic pinned layer;
forming a recess in the insulating film, the recess reaching a bottom of the insulating film;
forming a tunneling insulating film over a bottom and side walls of the recess and over the insulating film;
forming a magnetic free layer over the tunneling insulating film;
forming an upper electrode conductive film on the magnetic free layer; and
oxidizing a portion of the magnetic free layer along the side walls of the recess.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1A:
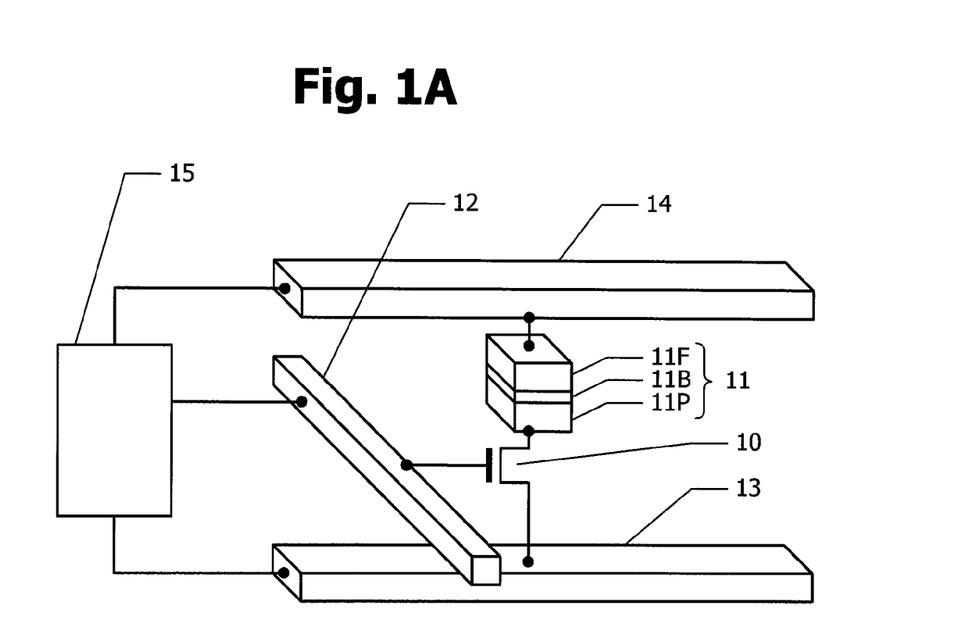
FIG. 1A is a schematic diagram of a spin injection type magnetic memory according to an embodiment.

FIG. 1A is a schematic diagram of one cell of a spin injection type magnetic memory according to an embodiment. One memory cell includes one transistor 10 and one MTJ device 11. The MTJ device 11 has a lamination structure that a tunneling insulating film 11B is sandwiched between a magnetic pinned layer 11P and a magnetic free layer 11F. A gate electrode of the transistor 10 is connected to a word line 12, and a source is connected to a source line 13. A drain of the transistor 10 is connected to a bit line 14 via the MTJ device 11. A control circuit 15 supplies a write or read signal to the word line 12, the source line 13 and the bit line 14 corresponding to a cell to be written or read.

Figure 1B:
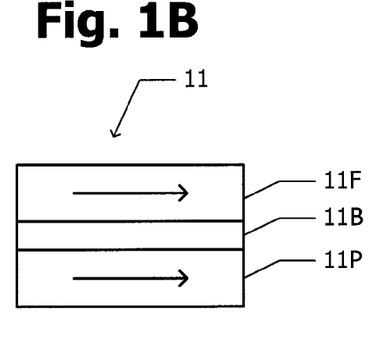
FIG. 1B is a cross sectional view of an MRJ device indicating magnetization directions in a low resistance state.

FIG. 1B illustrates magnetization directions in a low resistance state of the MTJ device 11. A magnetization direction of the magnetic pinned layer 11P and a magnetization direction of the magnetic free layer 11F are parallel with each other.

Figure 1C:
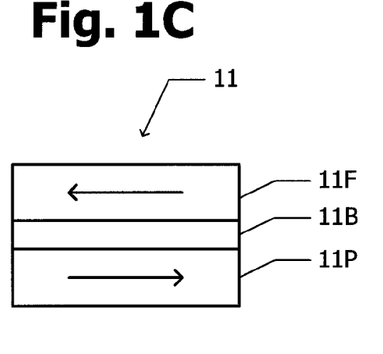
FIG. 1C is a cross sectional view of an MRJ device indicating magnetization directions in a high resistance state.

FIG. 1C illustrates magnetization directions in a high resistance state of the MTJ device 11. A magnetization direction of the magnetic pinned layer 11P and a magnetization direction of the magnetic free layer 11F are antiparallel with each other.

Description will now be made on a write method. In order to change the MTJ device into a low resistance state, a write current is applied from the bit line 14 to the source line 13. In this case, electrons spin-polarized in the same direction as the magnetization of the magnetic pinned layer 11P are transferred from the magnetic pinned layer 11P to the magnetic free layer 11F. The electrons transferred to the magnetic free layer 11F have a magnetization direction of the magnetic free layer 11F parallel to a magnetization direction of the magnetic pinned layer 11P. The MTJ device 11 becomes therefore the low resistance state illustrated in FIG. 1B.

In order to change the MTJ device into a high resistance state, a write current is applied from the source line 14 to the bit line 13. In this case, electrons are transferred from the magnetic free layer 11F to the magnetic pinned layer 11P. Electrons spin-polarized in a direction anti-parallel to the magnetization direction of the magnetic pinned layer 11P are reflected and return into the magnetic free layer 11F. The electrons returned into the magnetic free layer 11F have a magnetization direction of the magnetic free layer 11F antiparallel to a magnetization direction of the magnetic pinned layer 11P. The MTJ device 11 becomes therefore the high resistance state illustrated in FIG. 1C.

Next, description will be made on a read method. A read voltage is applied across the source line 13 and the bit line 14. Current corresponding in amount to a resistance of the MTJ device 11 will flow through the MTJ device. It is possible to judge from this current whether the device 11 is in a low resistance state or a high resistance state. An amount of the read current is set so as not to change a magnetization direction of the magnetic free layer 11F.

The embodiments to be described below may be applied not only to a 1Tr-1MTJ type memory cell illustrated in FIG. 1A, but also to a 1Tr-2MTJ type memory cell, and further not only to a spin injection type magnetic memory, but also to a current-magnetic field write type magnetic memory.

First Embodiment

With reference to FIGS. 2A to 2M, description will be made on a manufacturing method for an MTJ device according to the first embodiment.

Figure 2A:
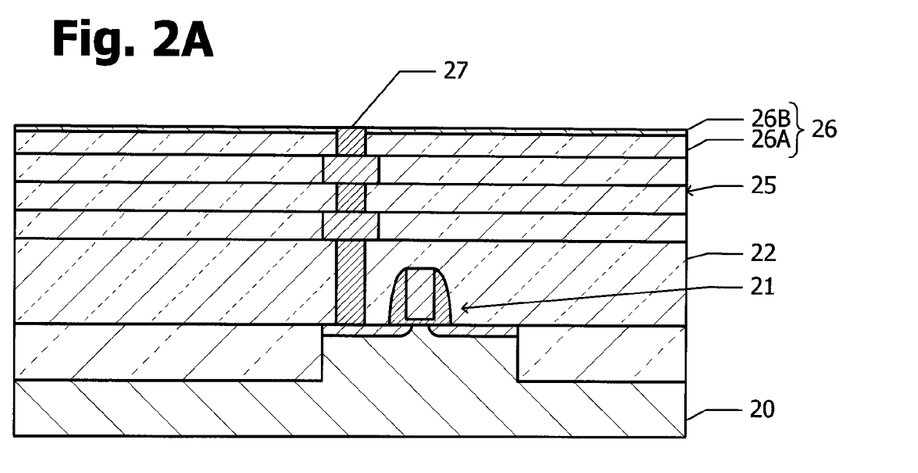
FIGS. 2A to 2L are cross sectional views of a magnetic tunneling junction device at intermediate stages of a manufacturing method for a magnetic tunneling junction device of a first embodiment.

As illustrated in FIG. 2A, a MOS transistor 21 is formed in an active region defined in the surface layer of a substrate 20 of silicon or the like. An interlayer insulating film 22 is formed on the substrate 20 to cover the MOS transistor 21. A multi-layer wiring layer 25 is formed on the interlayer insulating film 22. An interlayer insulating film 26 in the uppermost layer of the multi-layer wiring layer 25 has a two-layer structure of, e.g., a silicon oxide film 26A and a silicon carbide film 26B. A conductive plug 27 of tungsten (W) or the like is buried in the interlayer insulating film 26. The conductive plug 27 is connected to the drain of the MOS transistor 21 via underlying wirings and conductive plugs.

Figure 2B:
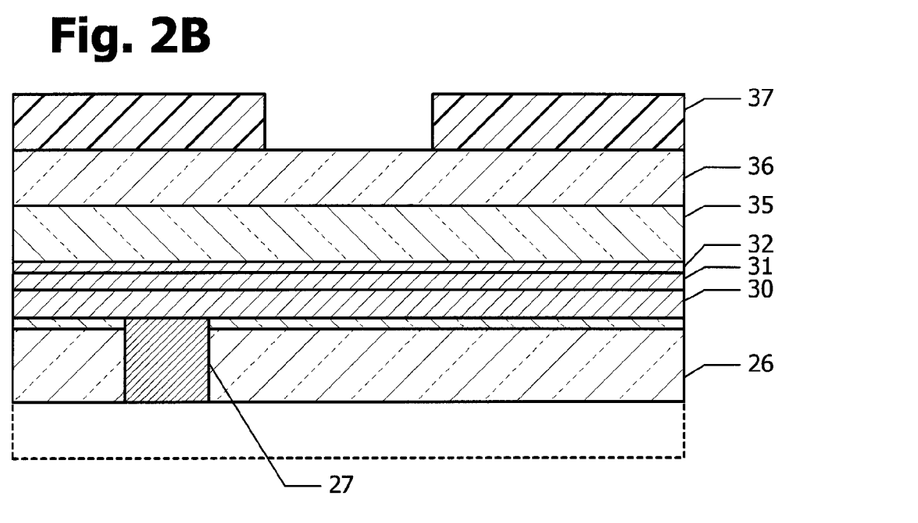

As illustrated in FIG. 2B, a lower electrode 30, an antiferromagnetic layer 31, and a magnetic pinned layer 32 are sequentially deposited on the interlayer insulating film 26. In FIGS. 2B to 2M, a detailed structure under the interlayer insulating film 26 is omitted.

Conductive material such as Ta is used for the lower electrode 30, and a thickness of the lower electrode 30 is, e.g., 30 nm. Antiferromagnetic material such as PtMn is used for the antiferromagnetic layer 31. A thickness of the antiferromagnetic layer 31 is, e.g., 15 nm. Ferromagnetic material such as CoFeB is used for the magnetic pinned layer 32, and a thickness of the magnetic pinned layer 32 is, e.g., 3 nm. In depositing these layers, sputtering is used for example. The magnetic pinned layer 32 is electrically connected to the conductive plug 27 via the antiferromagnetic layer 31 and the lower electrode 30.

An insulating film 35 and a hard mask film 36 are formed on the magnetic pinned layer 32. Silicon nitride for example is used for the insulating film 35, and the thickness of the insulating film 35 is, e.g., 20 nm. Silicon oxide for example is used for the hard mask film 36, and the thickness of the hard mask film 36 is, e.g., 30 nm. For example, a chemical vapor deposition (CVD) is applied for forming the insulating film 35 and the hard mask film 36.

A resist pattern 37 is formed on the hard mask film 36. The resist pattern 37 has an opening at a position slightly displaced from the conductive plug 27 in the in-plane direction. A planar shape of this opening is a rectangle whose shorter and longer side lengths are 60 nm and 120 nm, respectively.

Figure 2C:
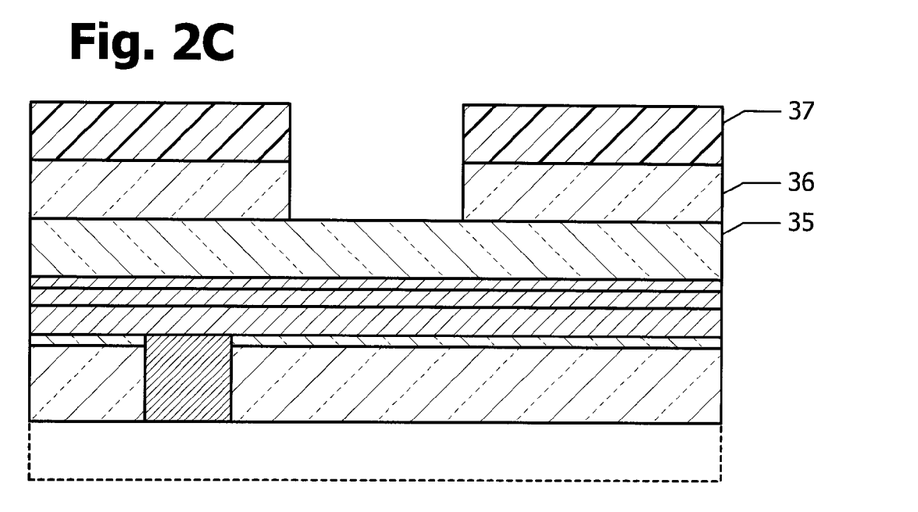

As illustrated in FIG. 2C, by using the resist pattern 37 as an etching mask, the hard mask film 36 is etched to form an opening. In etching the hard mask film 36, for example, dry etching using mixture gas of $CF_4$ and $CHF_3$ is applied. After the opening is formed through the hard mask film 36, the resist pattern 37 is removed by ashing.

Figure 2D:
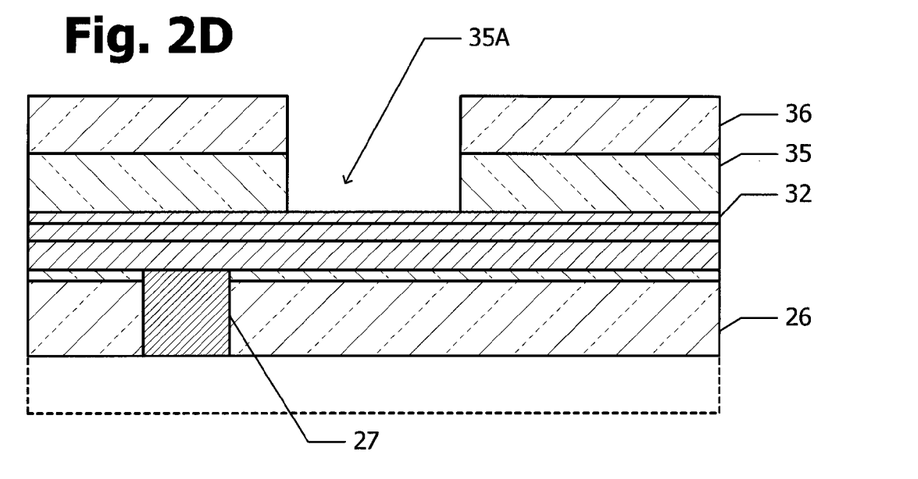

As illustrated in FIG. 2D, by using the hard mask film 36 as an etching mask, the insulating film 35 is etched to form a recess 35A reaching the bottom of the insulating film 35. A planar shape of the recess 35A is a rectangle reflecting a planar shape of the opening formed in the hard mask film 36. The planar shape of the recess 35A may be square or other shapes. In etching the insulating film 35, dry etching using, e.g., $CF_4$ is applied. The recess 35A is disposed at the position which is not overlapped with the conductive plug 27 as viewed in plan.

Figure 2E:
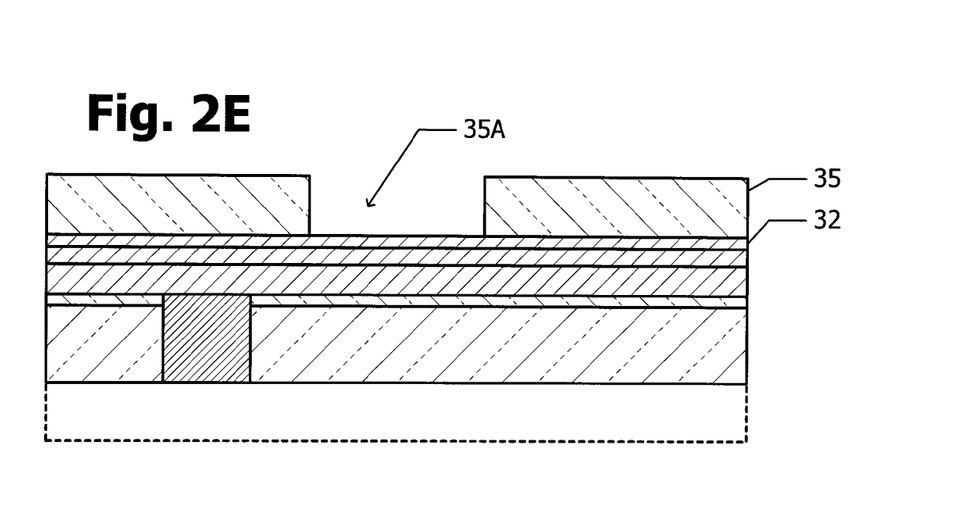

As illustrated in FIG. 2E, the hard mask film 36 (FIG. 2D) is removed by using dilute hydrofluoric acid. The magnetic pinned layer 32 is exposed on the bottom of the recess 35A formed in the insulating film 36.

Figure 2F:
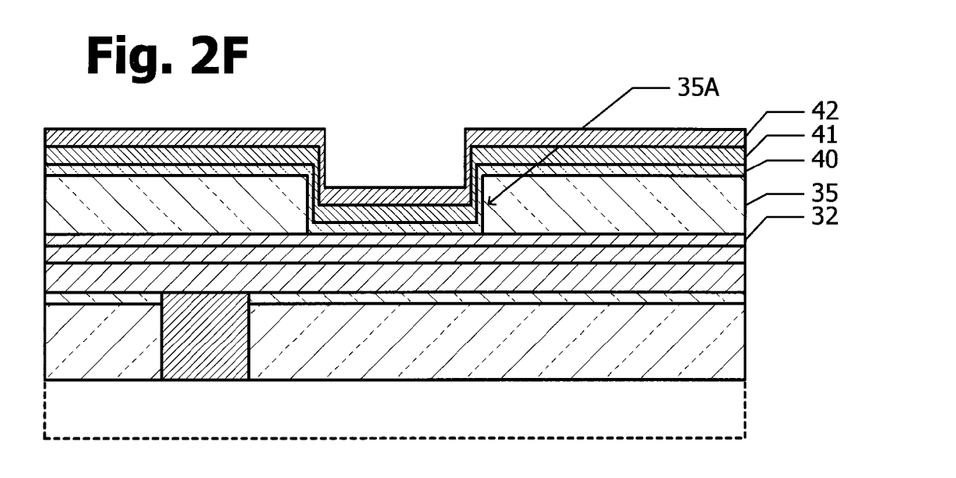

As illustrated in FIG. 2F, a tunneling insulating film 40 if formed on the bottom and side walls of the recess 35A and on the insulating film 35. Magnesium oxide (MgO) for example is used for the tunneling insulating film 40, and the thickness of the tunneling insulating film 40 is, e.g., 1 nm. For example, sputtering is applied for forming the tunneling insulating film 40. The tunneling insulating film 40 formed by sputtering is thinner in a portion along the side walls of the recess 35A than in a portion on the flat top surface.

A magnetic free layer 41 is formed on the tunneling insulating film 40. Ferromagnetic material such as CoFeB is used for the magnetic free layer 41. For example, sputtering is applied for forming the magnetic free layer 41. A thickness of the magnetic free layer 41 deposited on the bottom of the recess 35A and on the top surface of the insulating film 35, i.e., on the flat surfaces is, e.g., 2.5 nm. The magnetic free layer 41 deposited on the side walls of the recess 35A is thinner than the magnetic free layer 41 on the flat surfaces. The ferromagnetic material of the magnetic free layer 41 loses ferromagneticity and becomes non-magnetic by oxidization.

An upper electrode conductive film 42 is formed on the magnetic free layer 41. Material maintaining conductivity even under oxidization, e.g., ruthenium (Ru) is used for the upper electrode conductive film 42. For example, sputtering is applied for forming the upper electrode conductive film 42. A thickness of the upper electrode conductive film 42 on the flat surfaces is, e.g., 10 nm. Of the upper electrode conductive film 42, a portion along the side walls of the recess 35A is thinner than the upper electrode conductive film 42 on the flat surfaces.

Figure 2G:
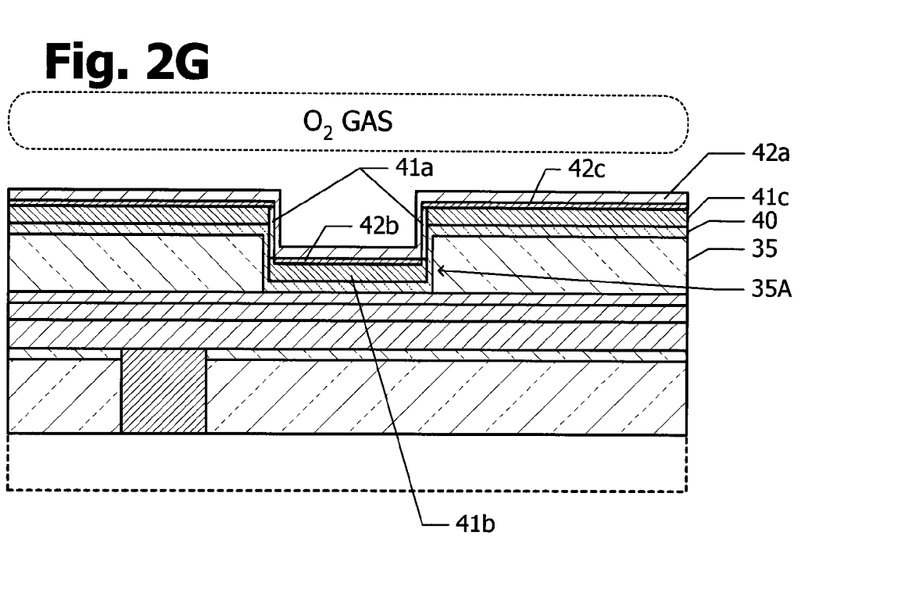

As illustrated in FIG. 2G, heat treatment is performed in an oxygen gas atmosphere. For example, a heat treatment temperature is 300° C., and a heat treatment time is 3 minutes. This heat treatment oxidizes a surface layer portion of the upper electrode conductive film 42 to form an oxide conductive film 42a made of ruthenium oxide (RuO). Since a thickness of the upper electrode conductive film 42 is thinner on the side walls of the recess 35A than on the flat surfaces, oxidation reaction progresses to the interface between the upper electrode conductive film 42 and the magnetic free layer 41. The magnetic free layer 41 along the side walls of the recess 35A is also oxidized. As the magnetic free layer 41 is oxidized, a non-magnetic film 41a is formed.

The magnetic free layer 41 is separated by the non-magnetic film 41a into a first magnetic free layer 41b and a second magnetic free layer 41c. The first magnetic free layer 41b is disposed on the tunneling insulating film 40 on the bottom of the recess 35A, and the second magnetic free layer 41c is disposed over the insulating film 35. The non-magnetic film 41a is disposed along the side walls of the recess 35A, and extends from the first magnetic free layer 41b to the second magnetic free layer 41c.

The upper electrode conductive film 42 is partitioned into a first conductive portion 42b disposed on the first magnetic free layer 41b, a second conductive portion 42c disposed on the second magnetic free layer 41c, and a third conductive portion (oxide conductive film) 42a as a surface layer of the original upper electrode conductive film 42. The third conductive portion 42a is disposed on the first conductive portion 42b, the second conductive portion 42c and the non-magnetic film 41a.

The non-magnetic film 41a may be formed by exposing the upper electrode conductive film 42 to oxygen plasma instead of performing the heat treatment in the oxygen gas.

Figure 2H:
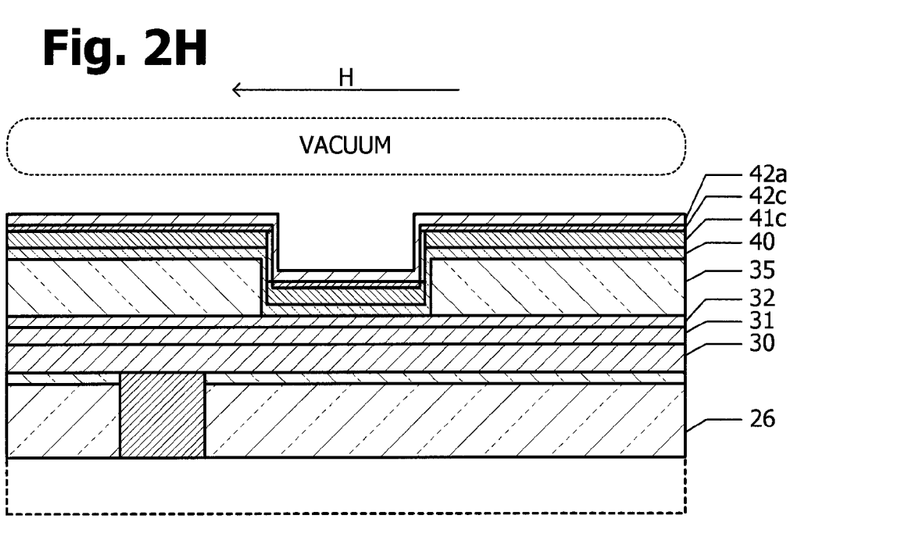

As illustrated in FIG. 2H, anneal for defining a magnetization direction is performed in vacuum and in magnetic field. Anneal temperature is set to, e.g., 350° C.

Figure 2I:
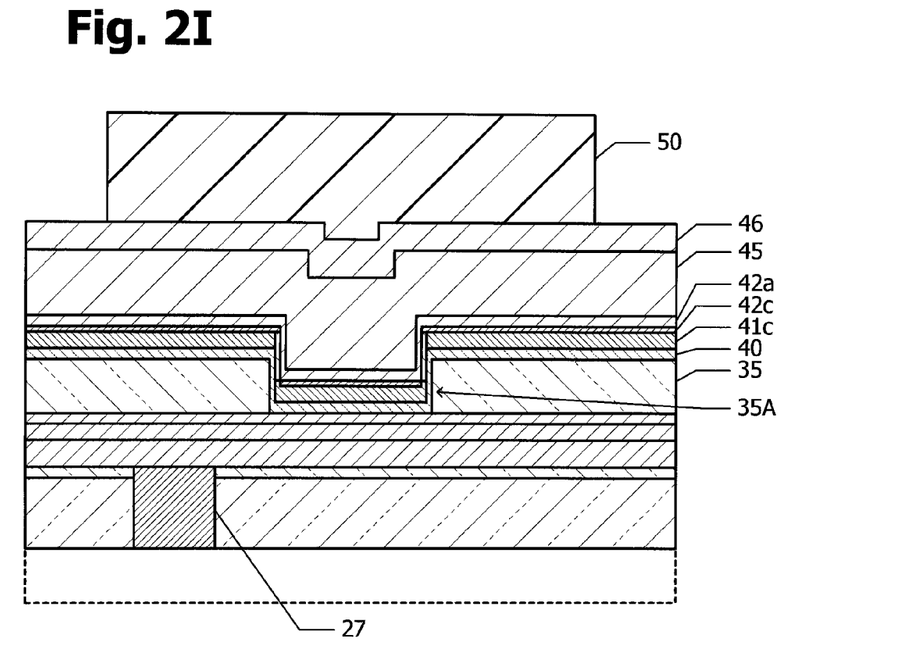

As illustrated in FIG. 2I, a conductive film 45 and a hard mask film 46 are formed on the third conductive portion 42a. For example, aluminum (Al) is used for the conductive film 45, and TiN is used for the hard mask film 46. A thickness of the conductive film 45 is, e.g., 60 nm, and a thickness of the hard mask film 46 is, e.g., 40 nm. For example, sputtering is applied for forming the conductive film 45 and the hard mask film 46.

A resist pattern 50 is formed on the hard mask film 46. The resist pattern 50 includes the conductive plug 27 and the recess 35A thereinside as viewed in plan. A planar shape of the resist pattern 50 is a rectangle whose shorter and longer side lengths are 120 nm and 200 nm, respectively.

Figure 2J:
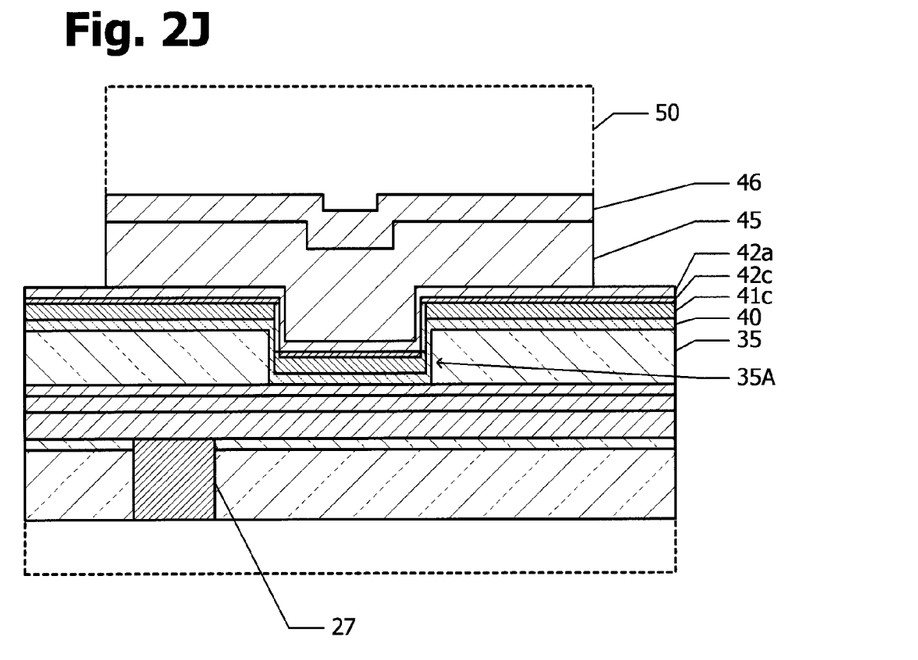

As illustrated in FIG. 2J, by using the resist pattern 50 as an etching mask, the hard mask film 46 and the conductive film 45 are etched. For etching the hard mask film 46 and the conductive film 45, dry etching using mixture gas of $Cl_2$ and $BCl_3$ is applied. After this etching, the resist pattern 50 is removed by ashing.

Figure 2K:
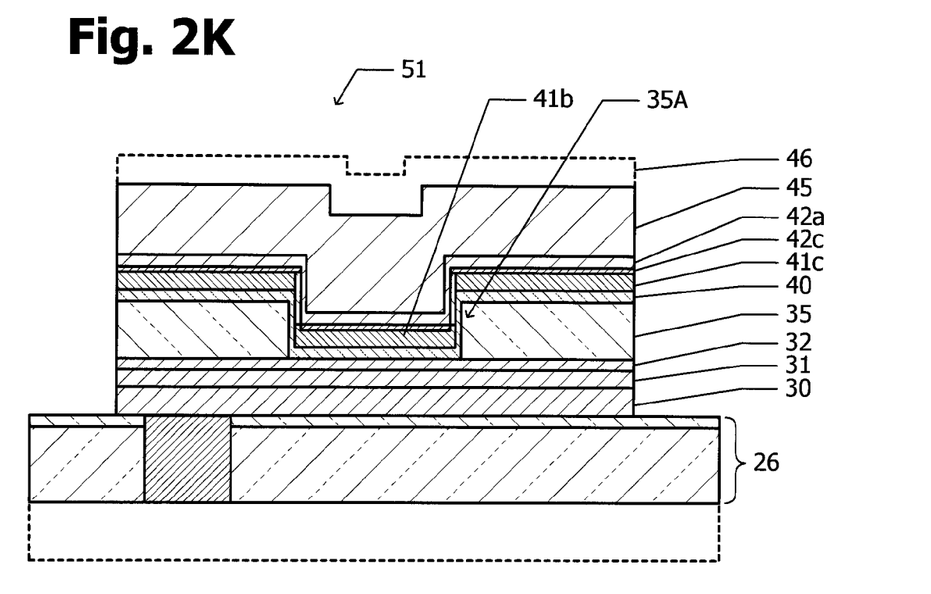

As illustrated in FIG. 2K, by using the hard mask film 46 and the conductive film 45 as an etching mask, the third conductive portion 42a, the second conductive portion 42c, the magnetic free layer 41, the tunneling insulating film 40, the insulating film 35, the magnetic pinned layer 32, the antiferromagnetic layer 31 and the lower electrode 30 are etched. For etching the third conductive portion 42a of RuO and the second conducting portion 42c of Ru, dry etching is applied using mixture gas of, e.g., $CF_4$ and $O_2$. For etching the magnetic free layer 41, the tunneling insulating film 40, the magnetic pinned layer 32 and the antiferromagnetic layer 31, dry etching is applied using, e.g., $CH_3OH$. For etching the insulating film 35 made of silicon nitride and the lower electrode 30 made of Ta, dry etching is applied using, e.g., $CF_4$. During this etching, the hard mask film 46 is also etched so that the hard mask film 46 disappears after the lower electrode 30 is etched.

A convex portion 51 is formed by a layer structure from the lower electrode 30 to the conductive film 45. The interlayer insulating film 26 is exposed along the circumferential area of the convex portion 51. The convex portion 51 includes an MTJ lamination film constituted of the magnetic pinned layer 32, the tunneling insulating film 40 on the bottom of the recess 35A and the first magnetic free layer 41b.

Figure 2L:
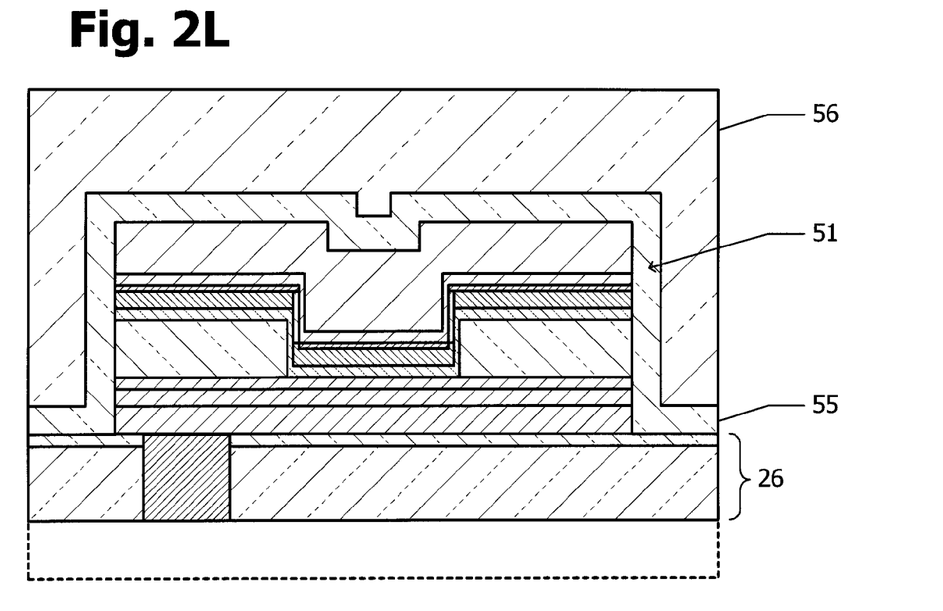

As illustrated in FIG. 2L, a barrier insulating film 55 is formed on the interlayer insulating film 26 and the convex portion 51. For example, silicon nitride is used for the barrier insulating film 55. A thickness of the barrier insulating film 55 is, e.g., 30 nm. For forming the barrier insulating film 55, CVD is applied for example.

An interlayer insulating film 56 is formed on the barrier insulating film 55. For example, silicon oxide is used for the interlayer insulating film 56. The interlayer insulating film 56 is formed by forming a silicon oxide film by CVD, and thereafter the surface of the silicon oxide film is planarized by chemical mechanical polishing (CMP). A thickness of the interlayer insulating film 56 is, e.g., 300 nm.

Figure 2M:
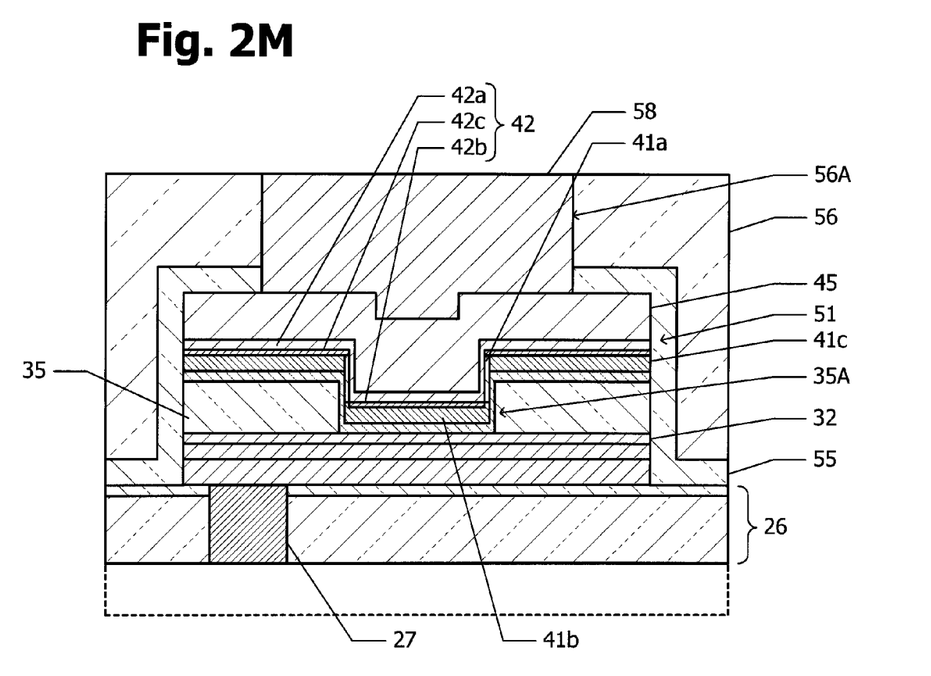
FIG. 2M is a cross sectional view of the magnetic tunneling junction device of the first embodiment.

As illustrated in FIG. 2M, a via hole is formed through the interlayer insulating film 56 and the barrier insulating film 55, reaching the conductive film 45. The via hole 56A is filled with a conductive plug 58 of tungsten (W) or the like. The conductive plug 58 is formed by forming a W film by CVD and thereafter performing CMP to remove an unnecessary portion of the W film. The magnetic pinned layer 32, the insulating film 35, the second magnetic free layer 41c and the upper electrode 42 are disposed at positions which are partially overlapped with the conductive plug 27.

In the first embodiment, without performing patterning by ion milling or the like, it is possible to disposed the first magnetic free layer 41b in a predetermined region, i.e., in the recess 35A. Since the facets of the tunneling insulating film and the magnetic free layer functioning as the MTJ device are not exposed, it is possible to prevent an increase in leakage current to be caused by the exposed facets.

The MTJ lamination film in the recess 35A functions as an MTJ device. An area occupied by the convex portion 51 is boarder than an area occupied by the recess 35A. Position alignment between the conductive plug 27 and the convex portion 51 is therefore easier than position alignment between the conductive plug 27 and the MTJ lamination film (the recess 35A). Similarly, position alignment between the upper conductive plug 58 and the convex portion 51 is also easy.

The first magnetic free layer 41b functioning as an MTJ device is magnetically separated from the second magnetic free layer 41c not functioning as an MTJ device by the non-magnetic film 41a. It is therefore possible to suppress an increase in write current even if an area of the convex portion 51 is made broader as viewed in plan.

In the first embodiment, silicon nitride and silicon oxide are used for the insulating film 35 and the hard mask film 36 illustrated in FIG. 2B, respectively. Conversely, silicon oxide may be used for the insulating film 35, and silicon nitride may be used for the hard mask film 36. It is sufficient to use insulating materials having different etching resistances from each other for the insulating film 35 and the hard mask film 36.

Second Embodiment

With reference to FIGS. 3A to 3D, description will be made on a manufacturing method for a magnetic tunneling junction device according to the second embodiment, by paying attention to the different points from the first embodiment method. Description on the same structure as those of the first embodiment is omitted.

Figure 3A:
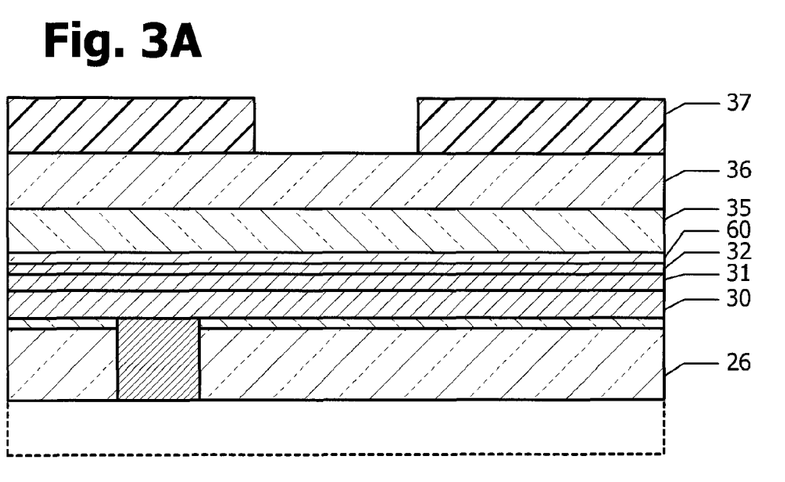
FIGS. 3A to 3C are cross sectional views of a magnetic tunneling junction device at intermediate stages of a manufacturing method for a magnetic tunneling junction device according to a second embodiment.

FIG. 3A corresponds to the stage illustrated in FIG. 2B of the first embodiment. In the second embodiment, an etching stopper film 60 is formed under the insulating film 35. Insulating material having a different etching resistance from that of the insulating film 35 is used for the etching stopper film 60. For example, if silicon nitride is used for the insulating film 35, silicon oxide is used for the etching stopper film 60. A thickness of the etching stopper film 60 is, e.g., 5 nm.

Figure 3B:
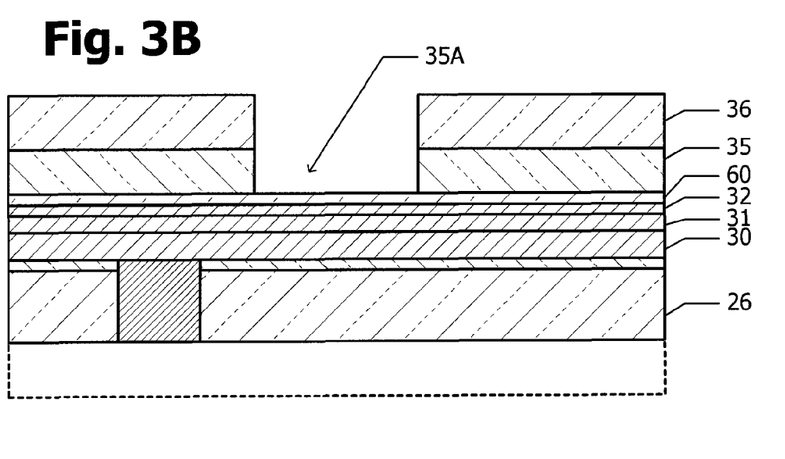

FIG. 3B corresponds to the stage illustrated in FIG. 2D of the first embodiment. Although the magnetic pinned layer 32 is exposed on the bottom of the recess 35A in the first embodiment, the etching stopper film 60 is exposed on the bottom of the recess 35A in the second embodiment.

Figure 3C:
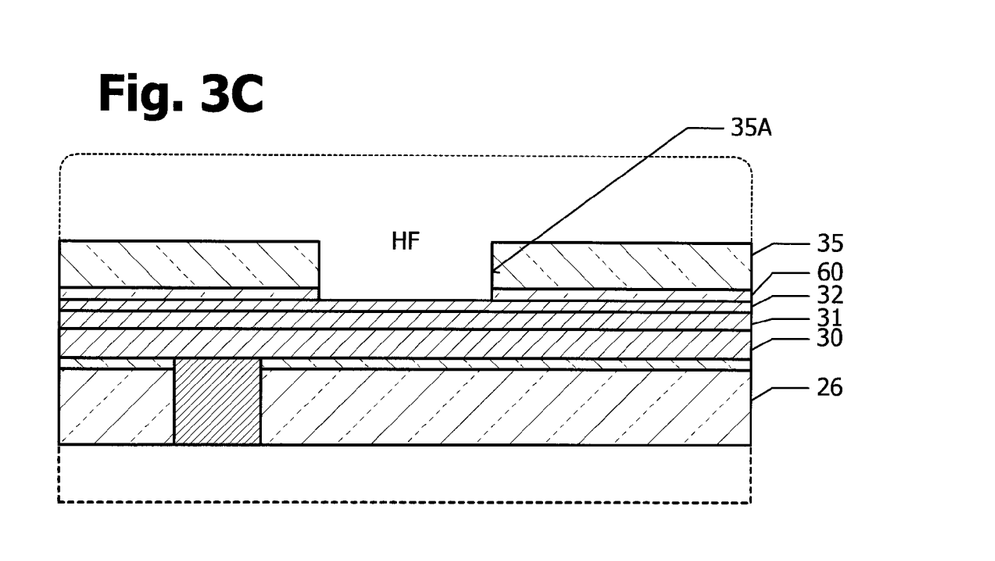

FIG. 3C corresponds to the stage illustrated in FIG. 2E of the first embodiment. When the hard mask film 36 (FIG. 3B) is etched with dilute hydrofluoric acid, the etching stopper film 60 exposed on the bottom of the recess 35A is also removed to expose the magnetic pinned layer 32. The subsequent processes are the same as those of the first embodiment.

Figure 3D:
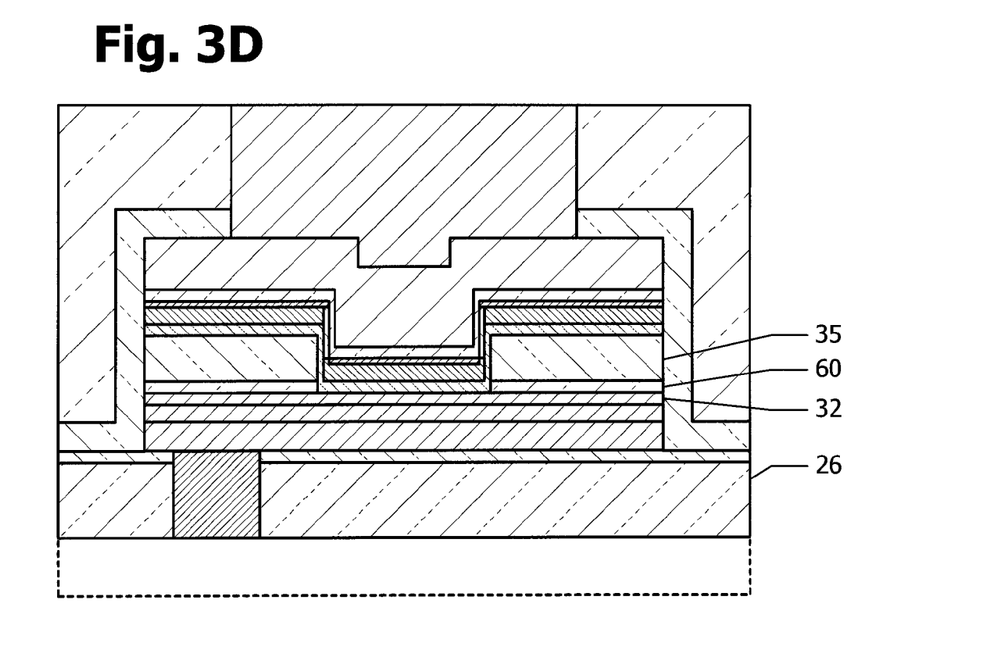
FIG. 3D is a cross sectional view of the magnetic tunneling junction device according to the second embodiment.

FIG. 3D corresponds to the stage illustrated in FIG. 2M of the first embodiment. The etching stopper film 60 is left between the magnetic pinned layer 32 and the insulating film 35. The other structures are the same as those of the magnetic tunneling junction device formed by the first embodiment method.

In the second embodiment, the magnetic pinned layer 32 is not directly exposed to a dry etching atmosphere at the step illustrated in FIG. 3B. It is therefore possible to reduce damages of the magnetic pinned layer 32 to be caused by dry etching.

Third Embodiment

Figure 4A:
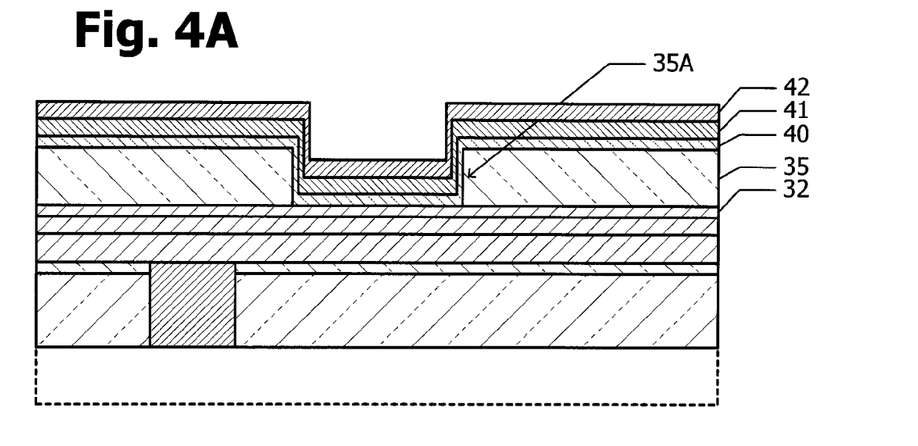
FIG. 4A is a cross sectional view of a magnetic tunneling junction device at an intermediate stage a manufacturing method for a magnetic tunneling junction device according to a third embodiment.
Figure 4B:
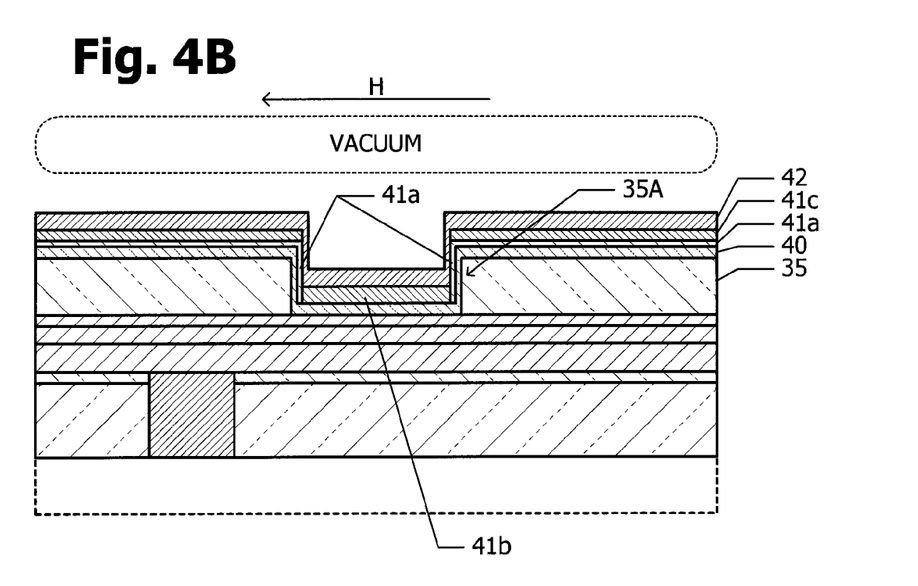
FIG. 4B is a cross sectional view of the magnetic tunneling junction device according to the third embodiment.

With reference to FIGS. 4A and 4B, description will be made on a manufacturing method for a magnetic tunneling junction device according to the third embodiment, by paying attention to the different points from the first embodiment method. Description on the same structure as those of the first embodiment is omitted.

FIG. 4A illustrates the same structure at the stage illustrated in FIG. 2F of the first embodiment. In the third embodiment, however, moisture-containing silicon nitride is used for the insulating film 35. The moisture-containing silicon nitride film is formed, e.g., by plasma CVD. The film forming conditions are, e.g., as follows:

source gas: mixture gas of $SH_4$ and $NH_3$;

film forming temperature: equal to or lower than 350° C.; and pressure: equal to or lower than 670 Pa (about 5 Torr).

If silicon nitride is used for the hard mask film 36 (FIG. 2B), moisture-containing silicon oxide is used for the insulating film 35. For example, the moisture-containing silicon oxide film is formed by plasma CVD. The film forming conditions are, e.g., as follows:

source gas: mixture gas of $SH_4$ and $N_2O$;

film forming temperature: equal to lower than 350° C.; and pressure: equal to or lower than 670 Pa (about 5 Torr).

In the third embodiment, heat treatment in the oxygen atmosphere illustrated in FIG. 2G of the first embodiment is not performed.

FIG. 4B corresponds to the anneal process in a magnetic field illustrated in FIG. 2H of the first embodiment. During this anneal, moisture contained in the insulating film 35 oxidizes a portion of the magnetic free layer 41 (FIG. 4A) to form a non-magnetic film 41a. The anneal in the magnetic field is performed under the condition that oxidation progresses to the interface between the magnetic free layer 41 and the upper electrode conductive film 42 along the side walls of the recess 35A. The ferromagnetic free layer 41 (FIG. 4A) does not left along the side walls of the recess 35A. The magnetic free layer 41 (FIG. 4A) deposited on the insulating film 35 is thicker than the magnetic free layer 41 (FIG. 4A) along the side walls of the recess 35A. The magnetic free layer 41 (FIG. 4A) deposited on the insulating film 35 is therefore oxidized only in a partial region on the substrate side to form a non-magnetic film 41a on which non-oxidized second magnetic free layer 41c is left.

In the first embodiment, the non-magnetic film 41a (FIG. 2G) is formed only along the side walls of the recess 35A. In the third embodiment, the non-magnetic film 41a elongates from a portion along the recess 35A to a position between the second magnetic free layer 41c and the insulating film 35. This elongated portion is in contact with the bottom of the second magnetic free layer 41c.

Also in the third embodiment, the first magnetic free layer 41b is magnetically separated from the second magnetic free layer 41c by the non-magnetic film 41a.

In the third embodiment, the anneal in the magnetic field functions also as a process of forming the non-magnetic film 41a. It is therefore possible to reduce the number of processes. Since the upper electrode conductive film 42 is not oxidized, it is also possible to use conductive material which changes insulative through oxidization as the upper electrode conductive film 42.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention have been described in detail, it should be understood that the various changes, substitutions, and alterations could be made hereto without departing from the spirit and scope of the invention.

What is claimed is:

1. A magnetic tunneling junction device comprising:
a magnetic pinned layer formed over a substrate;
an insulating film formed over the magnetic pinned layer;
a recess formed in and through the insulating film;
a tunneling insulating film formed on a bottom of the recess;
a first magnetic free layer formed over the tunneling insulating film;
a second magnetic free layer formed over the insulating film and made of a same magnetic material as the first magnetic free layer;
a non-magnetic film formed on side walls of the recess, extending from the first magnetic free layer to the second magnetic free layer and made of oxide of the magnetic material of the first magnetic free layer; and
an upper electrode disposed over the first magnetic free layer, the non-magnetic film and the second magnetic free layer, and electrically connected to the first magnetic free layer and the second magnetic free layer.

2. The magnetic tunneling junction device according to claim 1, wherein:
the upper electrode comprises:
a first conductive portion disposed on the first magnetic free layer and made of metal whose oxide has conductivity;
a second conductive portion disposed on the second magnetic free layer and made of a same metal as the first conductive portion; and
a third conductive portion disposed on thee first conductive portion, the second conductive portion and the non-magnetic film and made of oxide of the metal forming the first conductive portion.

3. The magnetic tunneling junction device according to claim 1, wherein the non-magnetic film elongates from a border of an opening of the recess to an upper surface of the insulating film, and the elongated portion is in contact with a bottom of the second magnetic free layer.

4. The magnetic tunneling junction device according to claim 1, wherein:
an interlayer insulating film and a conductive plug are exposed on an upper surface of the substrate; and
the magnetic pinned layer, the insulating film, the second magnetic free layer and the upper electrode are disposed at positions which are partially overlapped with the conductive plug.

* * * * *